(12) United States Patent
Ali

(10) Patent No.: US 8,593,181 B2
(45) Date of Patent: Nov. 26, 2013

(54) INPUT SWITCHES IN SAMPLING CIRCUITS

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 155 days.

(21) Appl. No.: 13/197,896

(22) Filed: Aug. 4, 2011

(65) Prior Publication Data
US 2013/0033302 A1 Feb. 7, 2013

(51) Int. Cl.
*G11C 27/02* (2006.01)
(52) U.S. Cl.
USPC ................................ 327/94; 327/437; 327/91
(58) Field of Classification Search
USPC .............................................. 327/437, 91, 94
See application file for complete search history.

(56) References Cited

U.S. PATENT DOCUMENTS

| | | | | |
|---|---|---|---|---|
| 5,170,075 A * | 12/1992 | de Wit | | 327/93 |
| 6,052,000 A * | 4/2000 | Nagaraj | | 327/94 |
| 6,518,901 B2 * | 2/2003 | Pinna et al. | | 341/122 |
| 6,977,544 B2 * | 12/2005 | Nicollini et al. | | 327/589 |
| 7,183,814 B2 * | 2/2007 | Kudo | | 327/91 |
| 7,274,222 B2 * | 9/2007 | Alacoque et al. | | 327/94 |
| 7,710,164 B1 * | 5/2010 | Sharma | | 327/94 |
| 2006/0192546 A1 * | 8/2006 | Geelen | | 324/94 |

* cited by examiner

*Primary Examiner* — Ryan Jager
(74) *Attorney, Agent, or Firm* — Kenyon & Kenyon, LLP

(57) ABSTRACT

A switch may include a MOS transistor alternatively operating in an ON phase and an OFF phase, a first voltage level shifter, and a second voltage level shifter. The MOS transistor may include a source for receiving an input signal, a drain for connecting to a load, and a gate. The first voltage level shifter may be selectively coupled between the source and the gate during the ON phase, and the second voltage level shifter may be selectively coupled between the gate and the source during the OFF phase.

20 Claims, 5 Drawing Sheets

INPUT SWITCHES IN SAMPLING CIRCUITS

FIELD OF THE INVENTION

The present invention is generally directed to circuits including switches. In particular, the present invention is directed to an apparatus for improving the linearity of an output and reliability of the switches.

BACKGROUND INFORMATION

Circuits commonly include MOS-based switches. For example, sampling circuits including input switches are commonly used at the front end of a circuit to receive and sample input signals. Specifically, analog-to-digital converters (ADCs) may include a sample-and-hold (or track-and-hold) circuit as an input switch for receiving analog input signals to be converted into digital codes. FIG. 1 illustrates a track-and-hold circuit as commonly known in the art. Referring to FIG. 1, the track-and-hold circuit 10 may include an input MOS transistor 12, a first set of switches 14, 16, 18, a second set of switches 20, 22, a voltage level shifter such as a capacitive level shifter (or a capacitor) 24, a load capacitor 26, a second MOS transistor 28, and an impedance 29. While MOS transistor 12 is illustrated as an NMOS for the convenience of discussion, MOS 12 may be a NMOS or PMOS transistor. MOS transistor 12 may include a gate (G), a source (S), and a drain (D). Additionally, MOS transistor 12 may include a back-gate (B) coupled to the body of the MOS 12. The MOS transistor 12 may operate alternatively in a first "track" phase (or, "ON" phase), controlled by a first clock (Φ1), during which MOS 12 is turned on and a second "hold" phase (or, "OFF" phase), controlled by a second clock (Φ2), during which MOS 12 is turned off. Voltage level shifter 24 is coupled between the gate (G) and source (S) of MOS 12 during the "track" phase via switches 14, 16. Gate (G) of MOS 12 is coupled to the ground (or a very low voltage level) during the "hold" phase via switch 20. Source (S) of MOS 12 may receive an input signal Vin which, in turn, may be generated from a voltage source Vs including a source impedance 29. Drain (D) of MOS 12 is coupled to a load capacitor 26 which is coupled to MOS switch 28 whose operating state is controlled by clock Φ1a. Back-gate (B) of MOS 12 is connected to the source (S) via a switch controlled by the first clock (Φ1) during the "track" phase, and is connected to a reference voltage such as ground (GND) via a switch 22 controlled by the second clock (Φ2) during the "hold" phase. Additionally, the track-and-hold circuit 10 may include parasitic capacitance Cp associated with MOS 12 at its source and drain. The parasitic capacitance Cp may also affect the quality of output signal $V_{sample}$.

Operating in the "track" phase when switches 14, 16, 18 are engaged according to clock Φ1 (Φ1 is high) and switches 20, 22 are disengaged according to clock Φ2 (Φ2 is low), MOS 12 (which is turned on) is connected to the input signal Vin through voltage level shifter 24 to bootstrap a voltage at the gate. Thus, if the bootstrapping voltage is $V_{BSTRAP}$, the voltage at gate (G) during the "track" phase is $V_G = V_{BSTRAP} + V_{in}$. In this way, the output $V_{sample}$ may sample (or track) Vin through the turned-on MOS 12. Further, switch 18 may also be engaged to couple back-gate (B) to source (S) according to the clock Φ1 to provide a back-gate bootstrapping to MOS 12. Next during the "hold" phase when switches 14, 16, 18 are disengaged according to clock Φ1 (Φ1 is low) and switches 20, 22 are disengaged according to clock Φ2 (Φ2 is high), the gate of MOS 12 is connected to ground (GND) (or a very low voltage level) to ensure MOS 12 is turned off. Thus, voltage at gate (G) during the "hold" phase is $V'_G \approx 0$. Further, switch 22 may also be engaged to couple back-gate (B) to ground according to the clock Φ2.

While the back-gate bootstrapping may help keep the source-to-bulk voltage approximately constant (subjecting to the limitation of the source impedance Zs), the voltage swing $(V_G - V'_G \approx V_{BSTRAP} + V_{in})$ at the gate of MOS 12 between the "track" and "hold" phases is dependent on the input signal Vin. Since the charge injection for the track-and-hold circuit 10 relates to voltage at the gate of MOS 12 and is therefore also dependent on input signal Vin. Charge injection is commonly understood as a voltage level change caused by parasitic capacitance (Cp) associated with NMOS or PMOS transistors in the track-and-hold circuit. When the charge injection is dependent on input signal Vin, it may cause further non-linearity in the output $V_{sample}$.

Another issue with the current art is that the gate (G) of MOS 12 is commonly grounded during the hold phase, while the source (S) and/or drain (D) of MOS 12 may reach high voltage values depending on the input signal (e.g., a sine wave). If the input signal causes the high voltages at the source (S) and/or drain (D) of MOS 12 exceed the maximum allowed values for MOS 12, the oxide of MOS 12 may break down, and the lifetime of the MOS 12 may be shortened.

DETAILED DESCRIPTION OF EXAMPLE EMBODIMENTS

There is a need for reducing the dependency of gate voltage of MOS 12 on input signal Vin to reduce non-linearity in the output signal $V_{sample}$ caused by charge injection. It is an objective of the present invention to reduce the dependency of the voltage swings between the "track" phase (or "ON" phase) and the "hold" phase (or "OFF" phase) of an input switch on the input signal, and therefore to improve linearity of the output signal $V_{sample}$ and the reliability of the MOS device.

Embodiments of the present invention may provide a switch that may include a MOS transistor alternatively operating in an ON phase and an OFF phase, a first voltage level shifter, and a second voltage level shifter. The MOS transistor may include a source for receiving an input signal, a drain for connecting to a load, and a gate. The first voltage level shifter may be selectively coupled between the source and the gate during the ON phase, and the second level shifter may be selectively coupled between a reference and the gate during the OFF phase, in which the second voltage level shifter shifts a voltage at the gate to a level lower than a voltage at the source and lower than a voltage at the drain.

Embodiments of the present invention may provide a switch that may include a MOS transistor alternatively operating in an ON phase and an OFF phase, and a voltage level shifter. The MOS transistor may include a source for receiving an input signal, a drain for connecting to a load, and a gate, in which the gate is selectively coupled to the input signal during the OFF phase.

Embodiments of the present invention may provide a switch that may include a MOS transistor alternatively operating in an ON phase and an OFF phase, a first voltage level shifter, and a second voltage level shifter. The MOS transistor may include a source for receiving an input signal, a drain for connecting to a load, and a gate. The first voltage level shifter may be selectively coupled between the source and the gate during the ON phase, and the second voltage level shifter may be selectively coupled between the gate and the source during the OFF phase.

Figure 1:
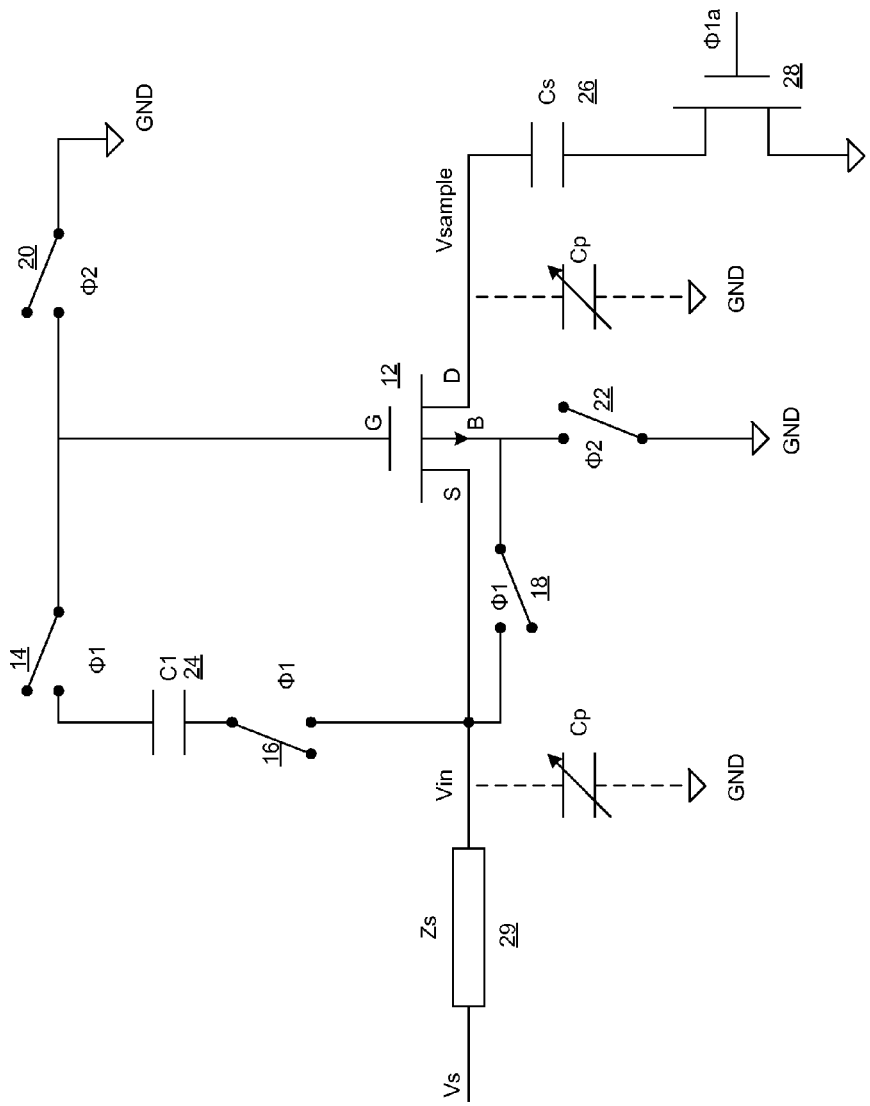
FIG. 1 illustrates an input switch including a track-and-hold circuit.
Figure 2:
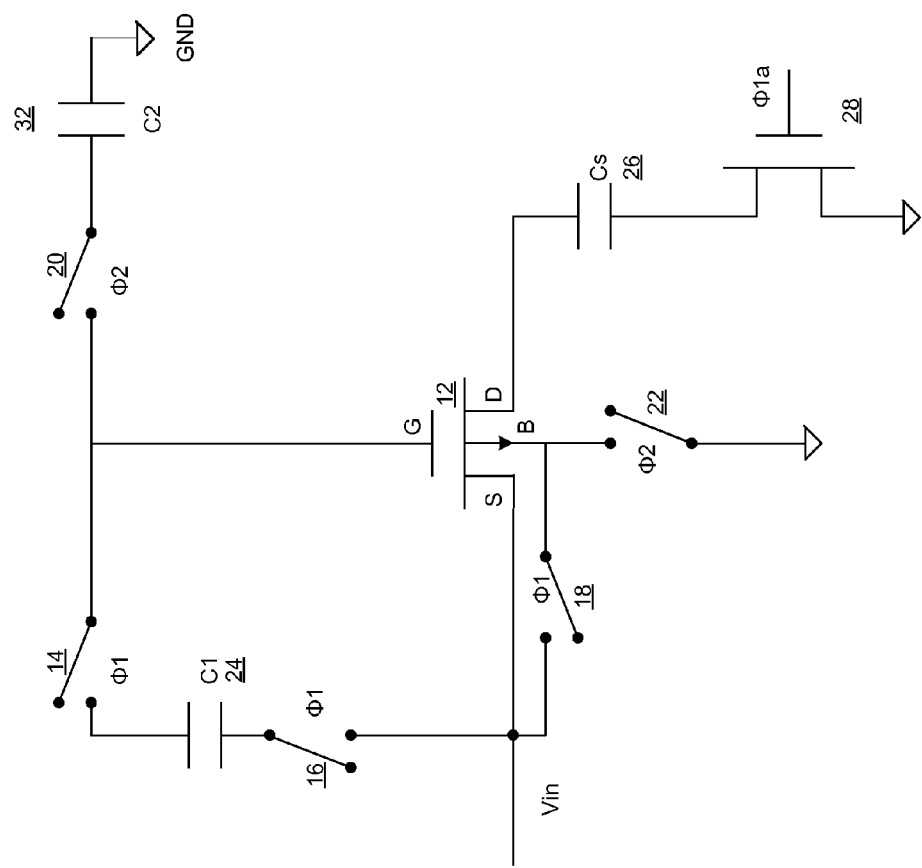
FIG. 2 illustrates an input switch including a track-and-hold circuit according to an exemplary embodiment of the present invention.
Figure 3:
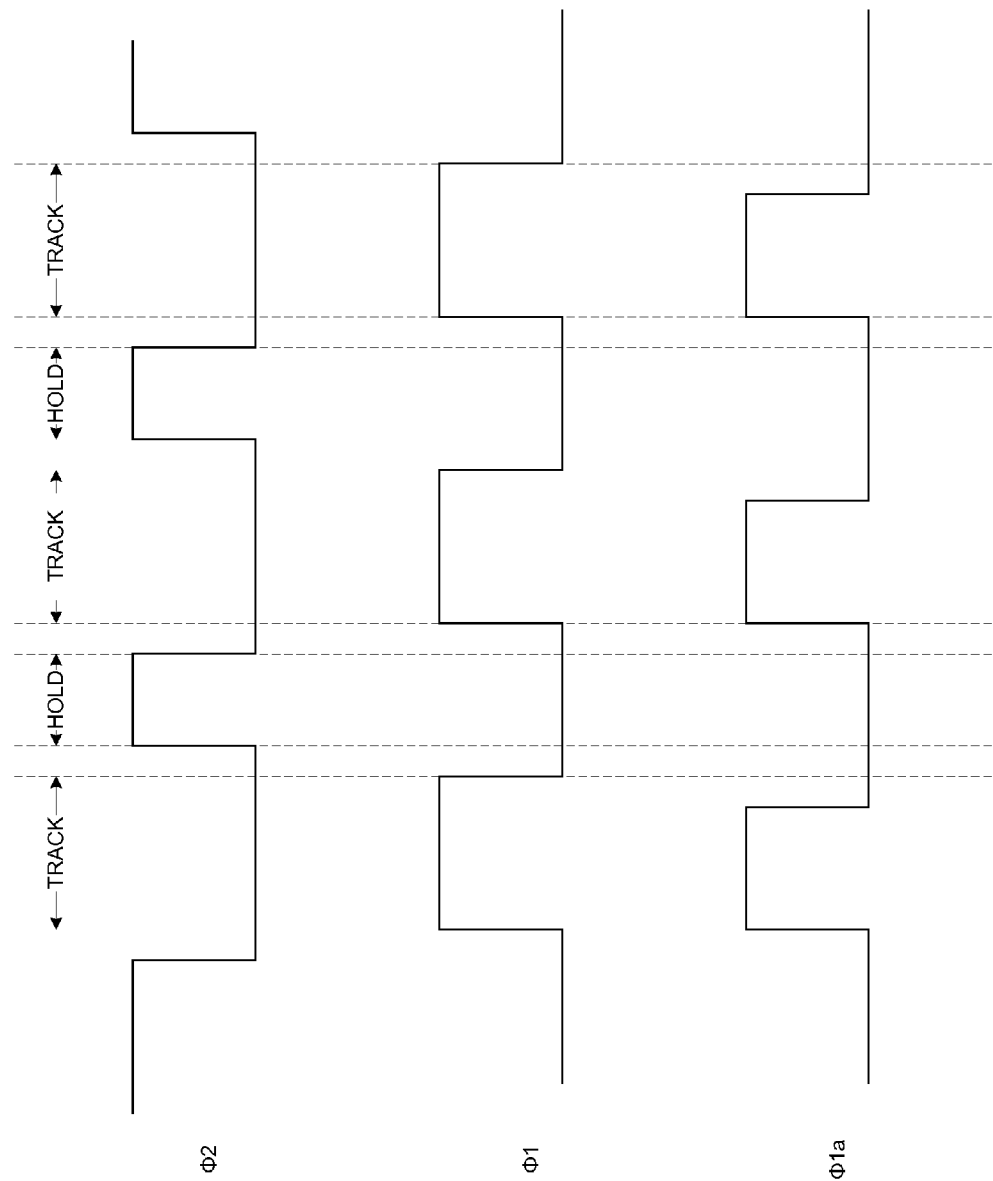
FIG. 3 illustrates clocks supplied to the input switch as shown in FIG. 2 according to an exemplary embodiment of the present invention.

FIG. 2 illustrates an input switch including a track-and-hold circuit according to an exemplary embodiment of the present invention. The track-and-hold circuit 30 as shown in FIG. 2 may include similarly constructed and labeled track-and-hold circuit 10 as shown in FIG. 1. Additionally, the track-and-hold circuit 30 include a second voltage level shifter such as a capacitive voltage level shifter 32 at a first end coupled to gate of MOS 12 via switch 20 and at a second end to ground (GND). The track-and-hold circuit 30 as shown in FIG. 2 may work with clocks (Φ1, Φ2, Φ1a) as shown in FIG. 3 according to an exemplary embodiment of the present invention. When the first clock (Φ1) is high and the second clock (Φ2) is low, the track-and-hold circuit 30 may operate in the "track" phase in which switches 14, 16, 18 are engaged and switches 20, 20 are disengaged. When the first clock (Φ1) is low and the second clock (Φ2) is high, the track-and-hold circuit 30 may operate in the "hold" phase in which switches 14, 16, 18 are disengaged and switches 20, 22 are engaged. Thus, during the "track" phase, gate voltage $V_G$ for MOS 12 may be the same $V_{BSTRAP}+V_{in}$. However, during the "hold" phase, gate voltage $V'_G$ for MOS 12 may be $V'_{BSTRAP}$ rather than the ground as shown in FIG. 1. In this way, the voltage swing at gate (G) of MOS 12 may be changed by the amount of $V'_{BSTRAP}$. Further, thus the reliability of the operation of MOS 12 may be improved because the voltage at the gate (G) is shifted to a level that is higher than ground but less than the lowest voltage at either the source (S) or the drain (D). This may ensure that MOS 12 is turned off and the voltage bias between the gate and source ($V_{SG}$) And the voltage bias between the gate and drain ($V_{DG}$) are both reduced (i.e., reduce voltage over oxides), and thus reduce the chance of breaking down.

Figure 4:
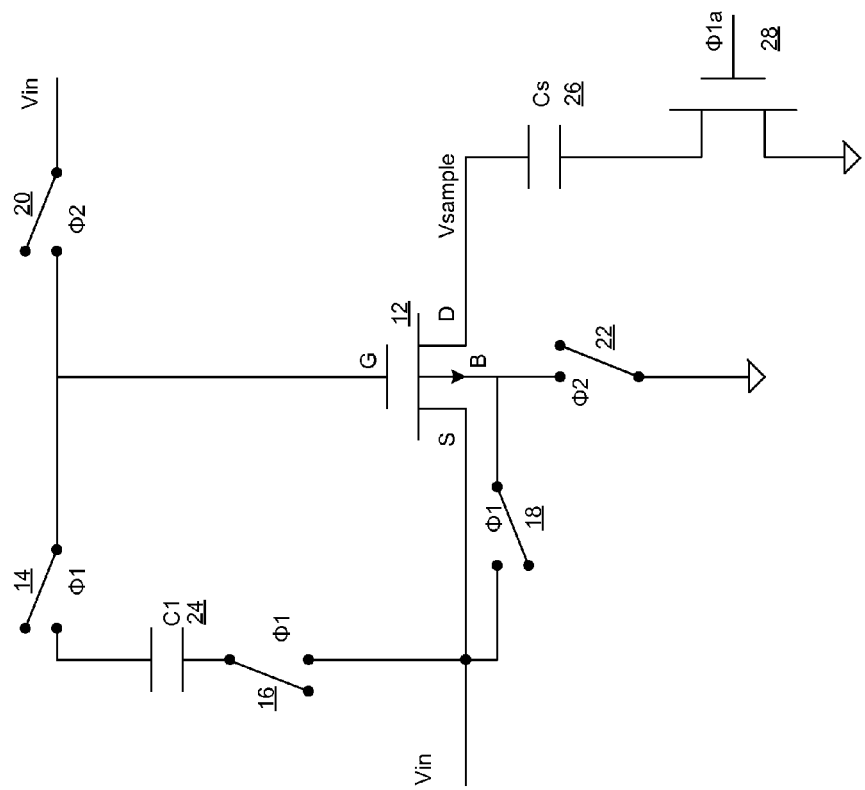
FIG. 4 illustrates another input switch including a track-and-hold circuit according to an exemplary embodiment of the present invention.

While the track-and-hold circuit 30 may improve the reliability of input switch operation, the voltage swing at gate (G) of MOS 12 may still depend on input signal Vin. FIG. 4 illustrates another input switch including a track-and-hold circuit 40 according to an exemplary embodiment of the present invention. To reduce the voltage swing at the gate (G) of MOS 12, when switch 20 is engaged, gate (G) of MOS 12 may be coupled to input signal Vin rather than to the ground (GND) as shown in FIG. 1. Similarly, the track-and-hold circuit 30 as shown in FIG. 4 may work with clocks (Φ1, Φ2, Φ1a) as shown in FIG. 3 according to an exemplary embodiment of the present invention. When the first clock (Φ1) is high and the second clock (Φ2) is low, the track-and-hold circuit 40 may operate in the "track" phase in which switches 14, 16, 18 are engaged and switches 20, 20 are disengaged. When the first clock (Φ1) is low and the second clock (Φ2) is high, the track-and-hold circuit 30 may operate in the "hold" phase in which switches 14, 16, 18 are disengaged and switches 20, 22 are engaged. Thus, during the "track" phase, gate voltage $V_G$ for MOS 12 may be the same $V_{BSTRAP}+V_{in}$. However, during the "hold" phase, gate voltage $V'_G$ for MOS 12 may be $V_{in}$. The resulting voltage swing between the "track" and "hold" phases is therefore $V_G-V'_{BSTRAP}$ which is substantially constant and independent of input signal $V_{in}$. Therefore, the linearity of $V_{sample}$ is substantially improved.

Figure 5:
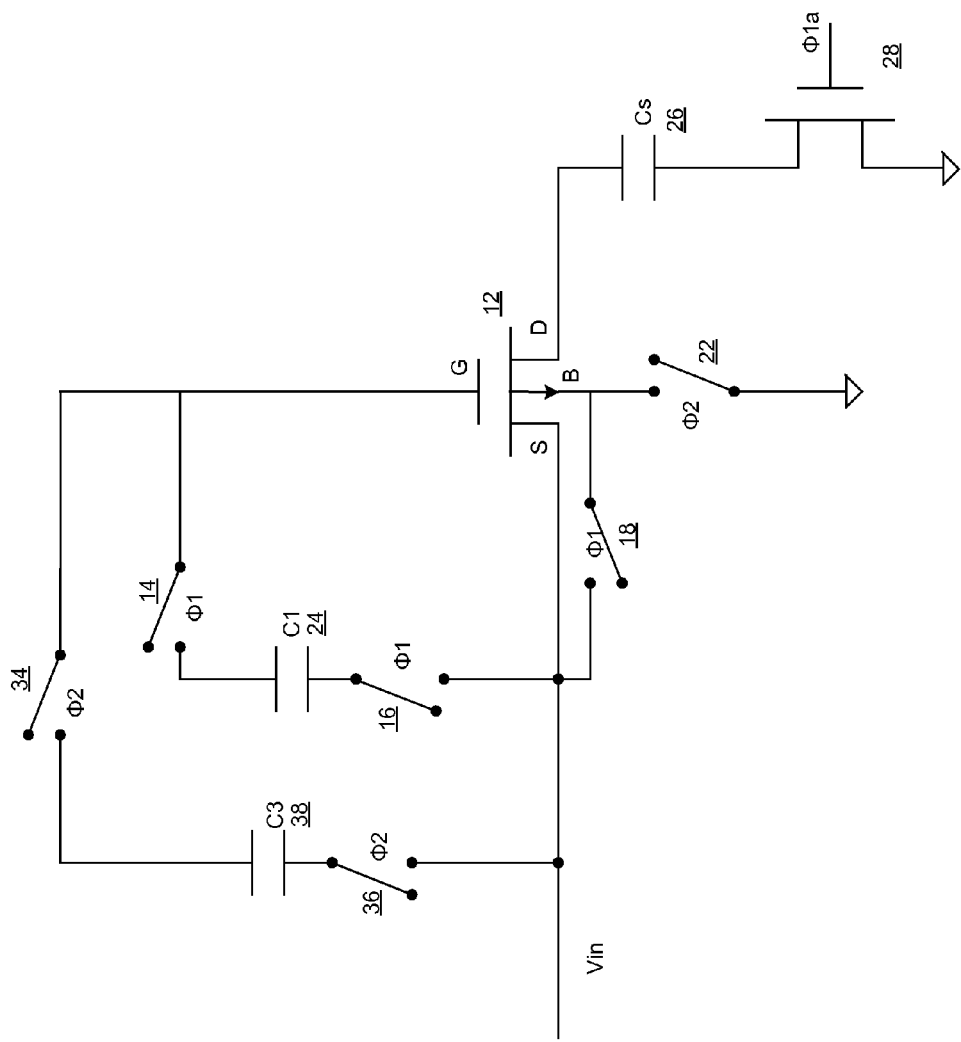
FIG. 5 illustrates another input switch including a track-and-hold circuit according to an exemplary embodiment of the present invention.

Although coupling gate voltage to input signal Vin may reduce the dependency of the gate voltage swing on Vin, when input voltage Vin overshoots (e.g., to the positive voltage for NMOS), MOS 12 as shown in FIG. 4 may not be turned off reliably during the "hold" phase. To improve the operational reliability of MOS 12 and linearity of $V_{sample}$, the gate voltage during the "hold" phase (while MOS 12 is off) may be bootstrapped from input signal Vin. FIG. 5 illustrates another input switch including a track-and-hold circuit 50 according to an exemplary embodiment of the present invention. The track-and-hold circuit 50 as shown in FIG. 5 may include similarly constructed and labeled components as shown in FIGS. 1, 2, and 4. Additionally, the track-and-hold circuit 50 may include switches 34, 36 and a voltage level shifter 38 that is, at a first end, coupled to the input signal Vin via switch 36 and at a second end, coupled to the gate (G) of MOS 12 via switch 34. Both switches 34, 36 are controlled by the second clock (Φ2) so that they are disengaged during the "track" phase and engaged during the "hold" phase. The voltage level shifter 38 may be a capacitive voltage level shifter that includes a capacitor C3. Further, thus the reliability of the operation of MOS 12 may be improved because the gate (G) is bootstrapped during the hold phase as well. This may ensure that the voltage bias between the gate and source ($V_{SG}$) And the voltage bias between the gate and drain ($V_{DG}$) are always fixed voltage values that cannot exceed the maximum allowed voltages for the MOS device.

In one embodiment, the voltage level shifter 38 may shift the voltage in a same amount but in an opposite direction with respect to the voltage level shifter 24. Thus, if voltage level shifter 24 shifts the input signal Vin by a positive voltage of $V_{BSTRAP}$ during the "track" phase, voltage level shifter 38 may shift the input signal Vin by a negative voltage of $-V_{BSTRAP}$ during the "hold" phase. In one exemplary embodiment, voltage level shifter 24 may shift the input signal Vin by a fixed positive voltage value during the "track" phase, and voltage level shifter 38 may shift the input signal Vin by a fixed negative voltage value during the "hold" phase.

In an alternative embodiment, the voltage level shifter 38 may shift the voltage in an opposite direction and by a different amount from the voltage shift by voltage level shifter 24. Thus, if voltage level shifter 24 may shift the input signal Vin by a positive voltage of $V_{BSTRAP}$ (where $V_{BSTRAP}>0$) during the "track" phase, voltage level shifter 38 may shift the input signal by a negative voltage of $V''_{BSTRAP}$ (where $V''_{BSTRAP}<0$) so long as the negative voltage shift $V''_{BSTRAP}$ ensures MOS 12 is turned off during the "hold" phase.

Because both voltage level shifters 24 and 38 shift voltages in reference of input signal Vin to the gate (G) of MOS 12, the voltage swing at the gate between the "track" and "hold" phases may be substantially constant and independent from input signal Vin, or $V_G-V'_G=V_{BSTRAP}-V''_{BSTRAP}$. When $V''_{BSTRAP}=-V_{BSTRAP}$, $V_G-V'_G=2 V_{BSTRAP}$. In this way, the both the reliability of the operation of the track-and-hold circuit 50 and linearity of output voltage $V_{sample}$ are improved.

While the present invention is discussed in light of the exemplary track-and-hold circuits that include an input switches, the principles of the present invention are not limited to the exemplary input switch and may be applied to other types of switches, which include MOS devices, to improve the linearity of output signals and reliability of the switches. For example, a MOS switch that operates between an "ON" state and an "OFF" state at a stage of a circuit known to a person of ordinary skill in the art may be similarly improved with present invention by providing bootstrapped gate voltages as described in FIGS. 2 to 5.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A switch, comprising:
   a MOS transistor alternatively operating in an ON phase and an OFF phase, the MOS transistor including a source for receiving an input signal, a drain for connecting to a load, a gate, and a back-gate that is switchably coupled to the input signal during the ON phase and to a reference during the OFF phase;
   a first voltage level shifter switchably coupled between the source and the gate during the ON phase; and
   a second voltage level shifter switchably coupled between the gate and the source during the OFF phase.

2. The switch of claim 1, wherein the MOS transistor is one of an NMOS transistor and a PMOS transistor.

3. The switch of claim 1, wherein the first voltage level shifter shifts the input signal at the source to the gate by a positive first voltage amount ($V_{BSTRAP}$) during the ON phase, and the second voltage level shifter shifts the input signal at the source to the gate by a negative second voltage amount ($V''_{BSTRAP}$) during the OFF phase.

4. The switch of claim 3, wherein the first and second voltage amounts are the same.

5. The switch of claim 3, wherein the first and second voltage amounts are different.

6. The switch of claim 1, wherein the first voltage level shifter is switchably coupled between the source and the gate during the ON phase via a first set of switches controlled by a first clock, and the second voltage level shifter is switchably coupled between the gate and the source during the OFF phase controlled by a second clock.

7. The switch of claim 6, wherein the load is switchably coupled to the reference controlled by a third clock.

8. The switch of claim 7, wherein the first, second, and third clocks are different clocks.

9. The switch of claim 6, wherein a phase of the first clock is opposite to a phase of the second clock.

10. The switch of claim 6, wherein a phase of the first clock is opposite to a phase of the second clock with an offset.

11. The switch of claim 1, wherein the MOS transistor is turned on by a voltage at the gate during the ON phase and turned off by the voltage at the gate during the OFF phase.

12. The switch of claim 1, wherein a voltage swing between the ON and OFF phases at the gate is substantially independent from the input signal.

13. A method for sampling a circuit, comprising:
    alternatively operating a MOS transistor in an ON phase and an OFF phase, the MOS transistor including a source for receiving an input signal, a drain for connecting to a load, a gate, and a back-gate;
    switchably coupling a first voltage level shifter between the source and the gate during the ON phase;
    switchably coupling a second voltage level shifter between the gate and the source during the OFF phase; and
    switchably coupling the back-gate to the input signal during the ON phase and to a reference during the OFF phase.

14. The method of claim 13, wherein the MOS transistor is one of an NMOS transistor and a PMOS transistor.

15. The method of claim 13, wherein the first voltage level shifter shifts the input signal at the source to the gate by a positive first voltage amount ($V_{BSTRAP}$) during the ON phase, and the second voltage level shifter shifts the input signal at the source to the gate by a negative second voltage amount ($V''_{BSTRAP}$) during the OFF phase.

16. The method of claim 15, wherein the first and second voltage amounts are one of the same and different.

17. The method of claim 13, wherein the first voltage level shifter is switchably coupled between the source and the gate during the ON phase via a first set of switches controlled by a first clock, and the second voltage level shifter is switchably coupled between the gate and the source during the OFF phase controlled by a second clock.

18. The method of claim 13, wherein the MOS transistor is turned on by a voltage at the gate during the ON phase and turned off by the voltage at the gate during the OFF phase.

19. The method of claim 13, wherein a voltage swing between the ON and OFF phases at the gate is substantially independent from the input signal.

20. A switching device, comprising:
    first means for alternatively switching in an ON phase and an OFF phase, the first means including a source for receiving an input signal, a drain for connecting to a load, a gate, and a back-gate switchably coupled to the input signal during the ON phase and to a reference during the OFF phase;
    second means for shifting a first voltage between the source and the gate during the ON phase; and
    third means for shifting a second voltage between the gate and the source during the OFF phase.

* * * * *